(12) United States Patent
Kondo et al.

(10) Patent No.: US 6,436,230 B1
(45) Date of Patent: Aug. 20, 2002

(54) PROCESS DEVICE

(75) Inventors: Tomomi Kondo, Himeji; Hidetoshi Kimura, Nirasaki, both of (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 09/717,279

(22) Filed: Nov. 22, 2000

(30) Foreign Application Priority Data

Nov. 26, 1999 (JP) .......................................... 11-336206

(51) Int. Cl.[7] .......................... H05H 1/00; C23C 16/00; H01L 21/00; H01J 1/00
(52) U.S. Cl. ........................... 156/345.46; 156/345.49; 156/345.47; 118/723 E; 118/723 MA; 118/723 MR; 315/111.41; 315/111.71
(58) Field of Search ..................... 156/345.47, 345.34, 156/345.46, 345.43, 345.44, 345.49; 118/723 E, 723 MA, 723 MR; 204/298.2, 298.21, 298.22, 298.37; 315/111.41, 111.71, 111.21

(56) References Cited

U.S. PATENT DOCUMENTS 5,444,207 A * 8/1995 Sekine et al. .......... 219/121.43
5,660,744 A * 8/1997 Sekine et al. .......... 219/121.43
6,014,943 A * 1/2000 Arami et al. ............ 118/723 E
6,190,495 B1 * 2/2001 Kubota et al. ............... 156/345

FOREIGN PATENT DOCUMENTS

JP 6-37055 2/1994
JP 6-53177 2/1994

* cited by examiner

Primary Examiner—Gregory Mills
Assistant Examiner—P. Hassanzadeh
(74) Attorney, Agent, or Firm—Pillsbury Winthrop LLP

(57) ABSTRACT

A process device and a method for processing a substrate. A dipole ring magnet (DRM) is arranged in a manner so that a leakage magnetic field in the neighborhood of the process device and at a position a prescribed distance therefrom is minimized. The dipole ring magnet (DRM) rotates around an outer periphery of a process chamber which has a plasma generation device, a substantially cylindrical shield plate covering an outer periphery of the dipole ring magnet. The shield is rotated coaxially with the dipole ring magnet and in a direction opposite to the rotation of the dipole ring magnet. In this way a magnetic field is generated in a direction that cancels leakage magnetic flux generated outside the dipole ring magnet.

20 Claims, 12 Drawing Sheets

PROCESS DEVICE

BACKGROUND

1. Field of Inventions

The present invention relates to a process device for processing a substrate to be processed under an application of a magnetic field, in particular to a process device suitable for suppressing a magnetic flux from leaking outside the process device.

2. Description of Related Art

In a manufacture process of semiconductor devices, process devices for implementing a sputtering process, a CYD process or the like on a silicon wafer (hereinafer simply referred to as "wafer") as a substrate to be processed have been used. In these process devices, a reactive process gas is filled in a process chamber. Under a plasma atmosphere obtained by converting the process gas into a plasma-state gas, on a wafer surface in the process chamber, a prescribed process is applied. Recently in particular, a higher degree of integration of a semiconducor device is strongly demanded and a wafer of a larger wafer aperture is developed. Accordingly, a process device capable of implementing a miniaturization process in short time is desired.

To this end, Japanese Patent Laid-open Application No. HEI 6-53177 proposes a plasma generation device for an etching device. The plasma generation device is provided with a dipole ring magnet hereinafter "dipole ring magnet" is simply referred as "DRM" in some cases) in which a plurality of anisotropic segment magnets are arranged in ring around an outer periphery of a process chamber to generate a magnetic field of high uniformity, thereby in a more uniform plasma atmosphere the process being implemented.

When the plasma generation device provided with the aforementioned DRM is used, a magnetic line of force generated from the DRM affects an influence on instruments in the surroundings of the plasma generation device. Accordingly, leakage of the magnetic line of force, that is, leakage magnetic flux, is necessary to be decreased. In particular, in a so-called multi-chamber semiconductor manufacture device where a plurality of process units is crowded in a narrow space to improve productivity, it is indispensable to avoid interference between process units each.

Accordingly, there are such proposals that outside the DRM a shield plate is disposed to shield magnetism or a counter magnet is disposed to cancel out the leakage magnetic flux. However, a sufficient decrease in the leakage magnetic flux has not been attained.

SUMMARY

The present invention is carried out to overcome the aforementioned problems. That is, the object of the present invention is to provide, in a process device provided with a DRM, the process device capable of sufficiently decreasing a magnetic flux leaking to the surroundings of the process device.

In order to solve the aforementioned problems, a process device involving the present invention comprises a chamber, an energy supply, a dipole ring magnet, a shield plate, and a shield plate rotation mechanism. The chamber accommodates a substrate to be processed to implement the process. The energy supply is provided to the chamber for supplying energy to a gas introduced in the chamber to convert the gas into a plasma-state gas. The dipole ring magnet is cylindrically arranged surrounding the chamber, on a circumference of the cylinder a plurality of magnets being arranged, the dipole ring magnet rotating in one direction around an axis of the cylinder. The shield plate is arranged surrounding an outer periphery of the dipole ring, magnet, the shield plate being supported rotatably with a rotation axis of the dipole ring magnet as an axis. The shield plate rotation mechanism rotates the shield plate in an opposite direction with respect to the dipole ring magnet.

That is, outside the DRM the cylindrical shield plate is disposed to cover the DRM and rotated coaxially with the rotating DRM and in a direction opposite to that thereof. Thereby, against a magnetic line of force directing outside of the DRM, a circular current is generated in each portion of the shield plate to generate a magnetic line of force of an approximately equal magnitude and in an opposite direction. Accordingly, the magnetic line of force coming out of the shield plate surface and the magnetic line of force coming out of the DRM are cancelled out to result in suppression of the leakage magnetic flux.

The process device comprises a process chamber having a chamber wall, conductive member, a dipole ring magnet, a shield plate, and a shield plate rotation mechanism. The process chamber is where a substrate to be processed is placed. The conductive member is disposed to a process chamber in the chamber wall for supplying energy to a gas introduced in a chamber wall to convert the gas into a plasma-state gas. The dipole ring magnet is cylindrically disposed surrounding the chamber wall, generating a magnetic field in the chamber wail, rotating in one direction around an axis of the cylinder. The shield plate is disposed surrounding an outer periphery of the dipole ring magnet, being supported rotatably without coming into contact with the dipole ring magnet. The shield plate rotation mechanism rotates the shield plate so as to suppress magnetic flux leaking outside of the dipole ring magnet.

That is, outside the DRM a rotatable shield plate is disposed, the rotatable shield plate being rotated to suppress a magnetic line of force from leaking outside the DRM.

Further, the process device of the present invention comprises constituting means, supplying means, magnetic field generating means, shielding means, and rotating means. The constituting means constitutes a process chamber where a process is applied to a substrate to be processed. The supplying means is disposed to the process chamber for supplying energy to a gas to convert the gas into a plasma state gas. The magnetic field generating means is cylindrically disposed surrounding the process chamber to be rotatable around an axis thereof, generating a magnetic line of force in the process chamber. The shielding means is disposed surrounding an outer periphery of the magnetic field generating means without coming into contact therewith for shielding a magnetic line of force leaking outside the magnetic field generating means. The rotating means rotates the magnetic flux shielding means so as to suppress the leakage magnetic flux.

That is, outside the magnetic field generating means rotatable shielding means is disposed, the rotatable shielding means being rotated to suppress a magnetic flux from leaking outside the magnetic field generating means.

DETAILED DESCRIPTION

As a preferred implementation mode, in the shield plate rotation mechanism, a rotational speed is set subordinate to a rotation of the dipole ring magnet.

As a preferred implementation mode of the present invention, the shield plate rotation mechanism comprises an external gear, an internal gear and a pinion gear. The external gear is disposed on an outer periphery surface of the dipole ring magnet. The internal gear is disposed on an inner periphery surface of the shield plate. The pinion gear engages with the external gear and the internal gear.

As a preferred implementation mode of the present invention, the shield plate rotation mechanism can be controlled in a rotational speed thereof independently from a rotation of the dipole ring magnet.

As a preferred implementation mode of the present invention, the shield plate rotation mechanism comprises a dedicated motor disposed to rotate it.

As a preferred implementation mode of the present invention, the shield plate rotation mechanism further comprises a sensor for detecting a magnetic flux density at a secluded position outside the shield plate. The shield plate rotation mechanism controls, based on the detected magnetic flux density, a rotational speed of the shield plate.

Further, as a preferred implementation mode of the present invention, the shield plate rotation mechanism further comprises a sensor for detecting a magnetic flux density at a secluded position outside the shield plate, the motor being controlled in its rotation based on the detected magnetic flux density.

Further, as a preferred implementation mode of the present invention, the shield plate has a plurality of minute through-holes bored therethrough.

Still further, as a preferred implementation mode of the present invention, in the rotating means for rotating the magnetic flux shielding means, its rotational speed is set according to the rotation of the magnetic field generating means.

Further, as a preferred implementation mode of the present invention, the rotating means for rotating the magnetic flux shielding means can be controlled in its rotational speed independent of the rotation of the magnetic field generating means.

In the following, process devices involving the present implementation modes will be explained with reference to the drawings.

(Embodiment 1)

Figure 1:
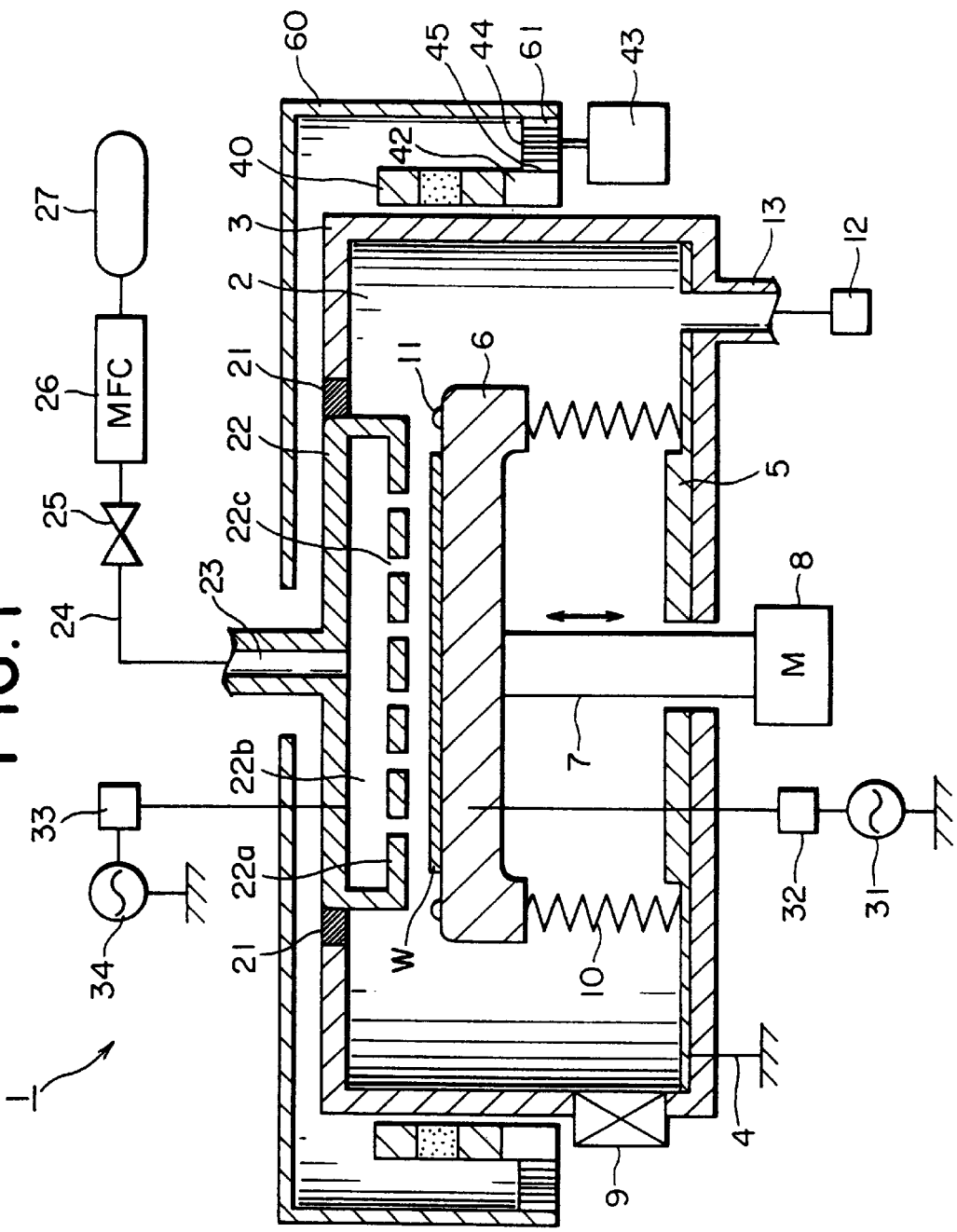
FIG. 1 is a vertical sectional view of an etching device involving a first embodiment

FIG. 1 is a schematic diagram showing a vertical sectional view of an etching device 1 as a process device involving the present embodiment. In the etching device 1, a process chamber 3 is disposed at an approximate center of the etching device 1, outside of the process chamber 3 a DRM (dipole ring magnet) 40 being disposed, further outside of the DRM 40 a shield plate 60 being disposed, the process chamber 3, the etching process is applied to a wafer W.

The process chamber 3 is formed in a cylinder consisting of anodized aluminum, a process vessel 2 inside the process chamber 3 being configured to be air tightly and hermetically sealed. The process chamber 3 itself is grounded by means of connecting to a grounding wire 4.

On an internal bottom surface of the process chamber 3, an insulation support plate 5 made of ceramics or the like is disposed, above the insulation support plate 5 an approximately cylindrical suspect 6 being accommodated. The approximately cylindrical suspect 6 mounts for instance a wafer W of a diameter of 12 inch thereon as a substrate to be processed. The susceptor 6 is made of for instance anodized aluminum, serving a lower electrode as plasma generating means.

The susceptor 6 is supported by a support 7 capable of moving vertically, due to driving force of such as an elevating motor 8 disposed outside the process chamber 3 being moved in a vertical direction in the figure. The FIG. 1 shows a position during etching, due to the elevating motor 8 the susceptor 6 being descended down to a gate valve 9 for loading/unloading disposed at a lower side portion of the process chamber 3. On the other hand, in the surroundings of the support 7, bellows 10 are attached to ensure air-tightness.

On the susceptor 6, an electrostatic chuck (not shown in the figure) for holding the wafer is disposed, the wafer W being mounted on a prescribed position on the electrostatic chuck.

At an upper surface outer perimeter of the susceptor 6, a conductive focusing ring 11 is circularly disposed. The focusing ring 11 serves in improving uniformity of plasma density in the surroundings of the wafer W.

At the bottom portion of the process chamber 3, an exhaust duct 13 communicating to a vacuum device 12 such as for instance a turbo-molecular pump is attached. By means of the vacuum device 12, the inside of the process chamber 3 can be evacuated up to a prescribed low pressure state, for instance 1333 mPa (10 mTorr).

The exhausting of the inside of the process chamber 3 as mentioned above and a low pressure state in the process chamber 3 by means of the vacuum device 12 or the like are automatically controlled based on signals. The signals are detected by a pressure sensor (not shown in the figure) attached inside the process chamber 3.

At an upper portion of the inside of the process chamber 3, through an insulating member 21 made of alumina for instance, an upper electrode 22 is disposed as plasma generating means. The upper electrode 22 is made of conductive material such as for instance anodized aluminum, and at least a surface 22a facing the wafer W may be formed of material conductive to high frequency such as for instance single crystal silicon. Further, the upper electrode 22 is formed in a hollow structure having a hollow portion 22b inside thereof, further at an upper center of the upper electrode 22 a gas inlet 23 being disposed. The gas inlet 23 is communicated with the hollow portion 22b. In order to supply uniformly a process gas over an entire process surface of the wafer W, lots of discharging holes 22c are bored.

To the gas inlet 23, a gas introducing duct 24 is connected, to the gas introducing duct 24, through a valve 25 and a mass flow controller (MFC) 26 for controlling a flow rate, a process gas supply source 27 being connected. In the present embodiment, from the process gas supply source 27, a prescribed process gas such as CF series etching gases or the like such as for instance CF4 or C4F8 gases are supplied. The etching gas, after controlling the flow rate by means of the mass flow controller 26, from the discharging holes 22c of the upper electrode 22, is uniformly discharged to the wafer W.

Next, a high frequency power supply system of the etching device 1 will be explained.

To the susceptor 6 that is a lower electrode, power from a first high frequency power source 31 is supplied by way of a matching device 33 having a blocking condenser or the like. The first high frequency power source 31 outputs high frequency power of a frequency of approximate 1 to 3 MHz, for instance 2 MHz. On the other hand, to an upper electrode 22, by way of a matching device 33, power from a second high frequency power source 34 is supplied. The second high frequency power source 34 outputs high frequency power of a frequency of 1 MHz or more and of higher frequency than that of the first high frequency power source 31, for instance 27.12 MHz.

Figure 2:
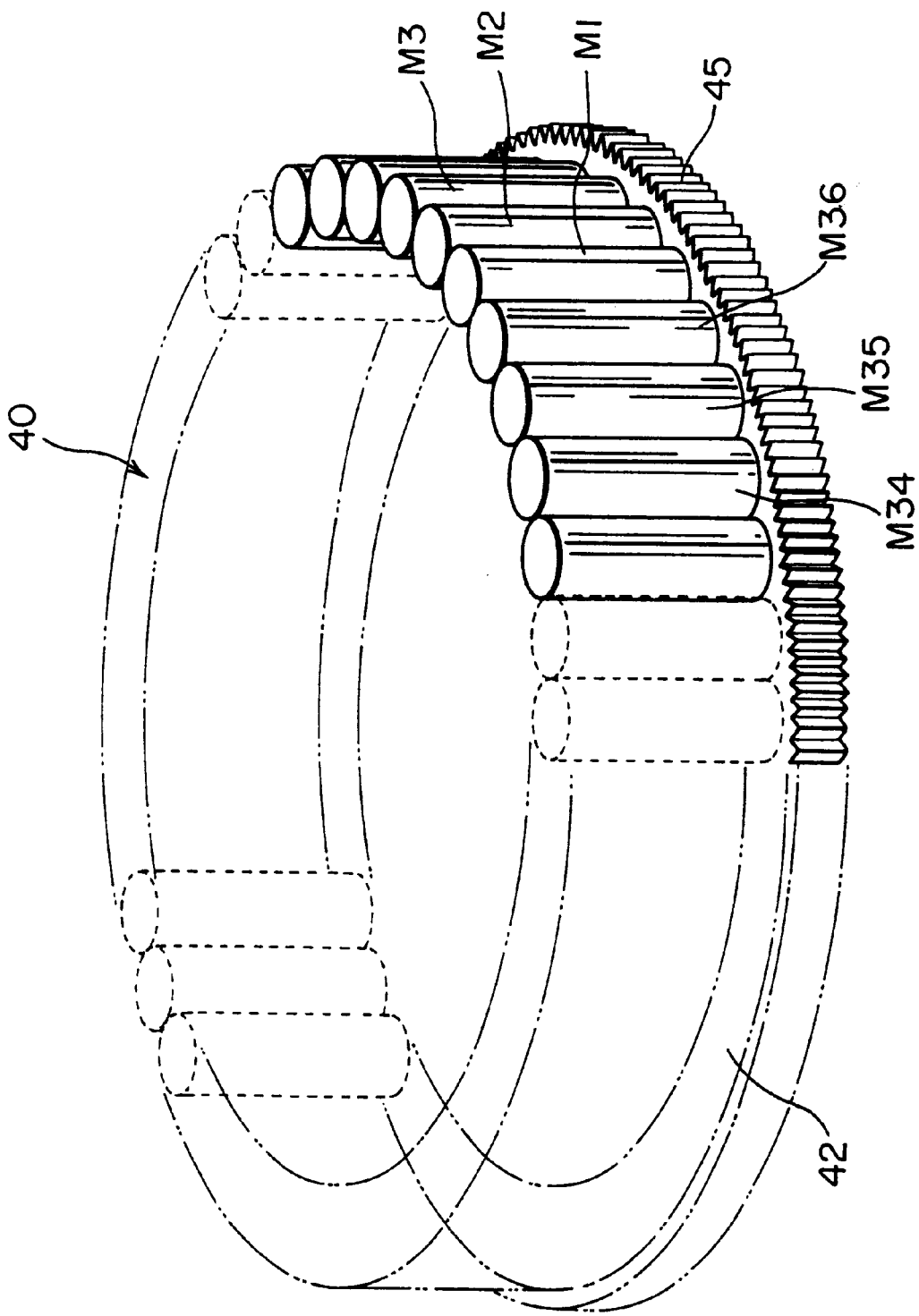
FIG. 2 is a perspective view of a dipole ring magnet (DRM) involving the first embodiment.

On an outer periphery of the process chamber 3, a dipole ring magnet (DRM) 40 is disposed. FIG. 2 is a perspective view showing a schematic configuration of the DRM 40 involving the present embodiment.

The DRM 40, as shown in FIG. 2 has 36 pieces of circular column segment magnets M1 to M36 arranged in annulus ting on an annulus ring-like rotary stage 42. These segment magnets M1 to M36 each have the same shape and same magnitude. When arranging on the rotary stage 42, as described later, each of these segment magnets is arranged to take a direction of magnetization in a direction different from those of the others. The rotary stage 42 itself, as described later, by means of a transmission mechanism consisting of a motor 43 and a gear train such as gears 44, 45 and 61, is made to rotate coaxially around an outer periphery of the process chamber 3, that is, concentrically.

Figure 3:
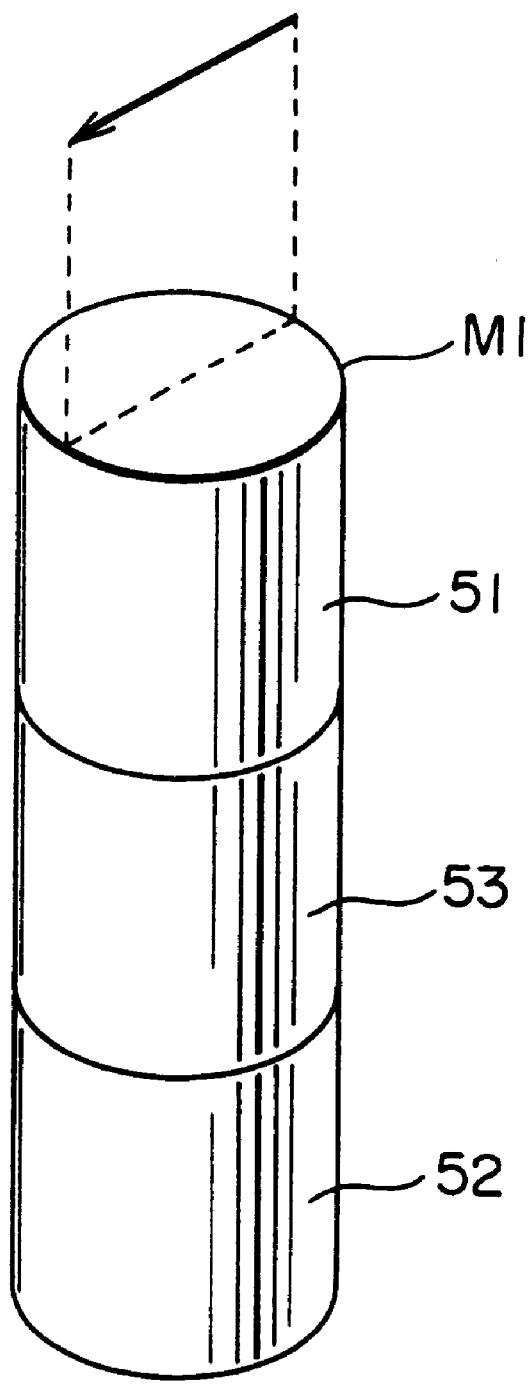
FIG. 3 is a perspective view of one of segment magnets involving the first embodiment.

FIG. 3 is a perspective view showing a schematic configuration of one segment magnet involving the present embodiment. In the DRM 40, the respective segment magnets M1 to M36 have the same shape and same magnitude. The segment magnet M1 for instance will be taken up as a representative example for explanation. The segment magnet M1 is formed in a circular column as a whole. Between magnetic materials 51 and 52 which are magnetized to be magnets of the same shape and same magnitude, a non-magnetic substance 53 of the same shape consisting of for instance aluminum material or the like is sandwiched to configure the segment magnet M1. Thus configured material is magnetized so that the magnetic materials 51 and 52 take a direction of magnetization in a direction shown by an arrow mark in FIG. 3 for instance. Thereby, the segment magnet M1 is configured. A tip end of an arrow mark in the figure denotes N pole, the directions of magnetization of the magnetic materials 51 and 52 being completely the same.

Figure 4:
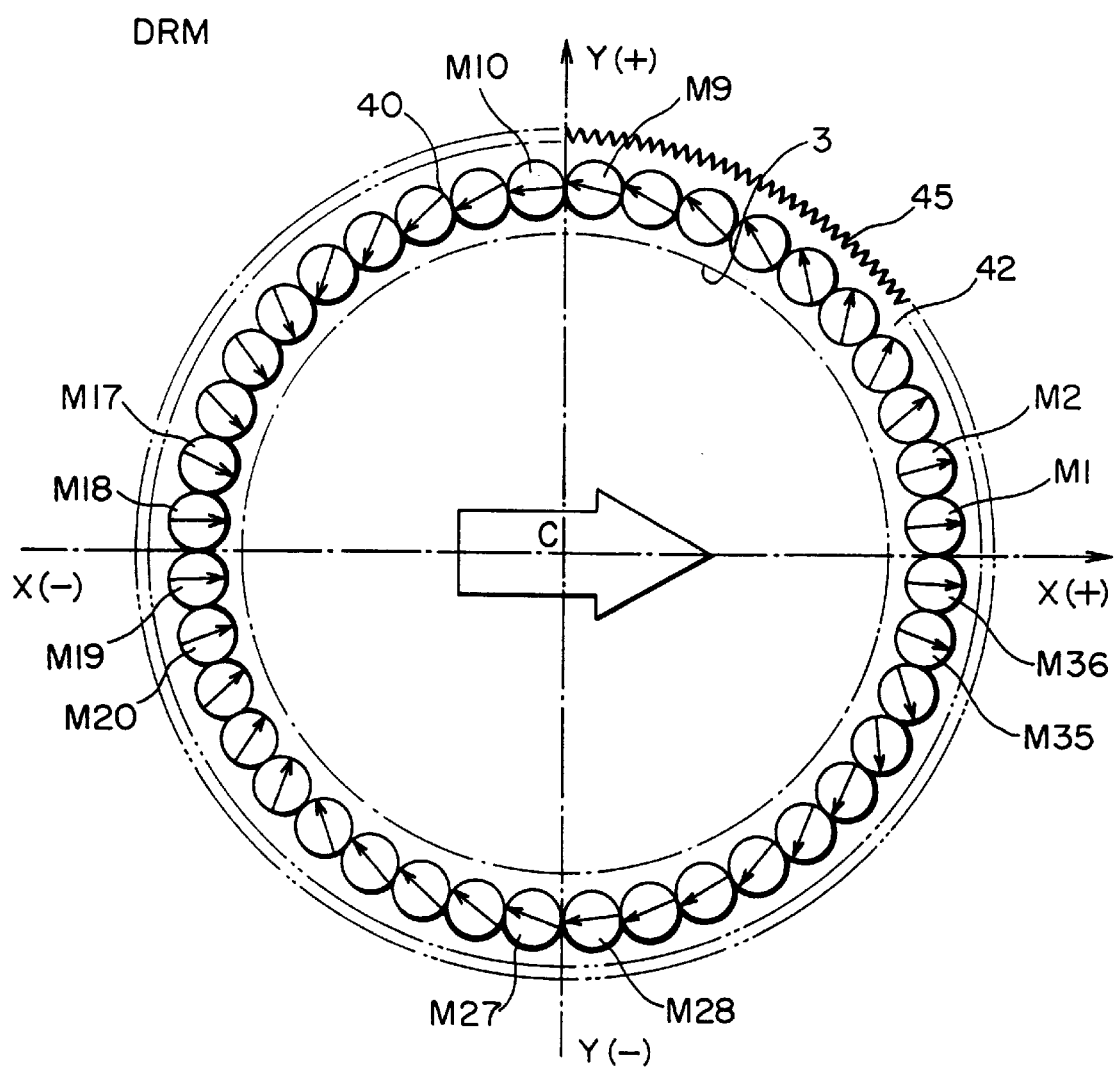
FIG. 4 is a plan view of a dipole ring magnet (DRM) involving the first embodiment.

FIG. 4 is a plan view showing a schematic configuration of the DRM 40 involving the present embodiment.

The other segment magnets M2 to M36 are configured completely identical with the segment magnet M1. These 36 pieces of the segment magnets having the same direction of magnetization are arranged as shown in FIG. 4 on the rotary stage 42. That is, the segment magnets M1 to M36 are arranged to take different directions of magnetization from each other so that after the segment magnets deviate 180° to go half around on the rotary stage 42, directions of magnetization of the segment magnets return to initial ones to go round.

For instance, when explaining following FIG. 4, the segment magnets M1 and M19 are in the same direction of magnetization, in the present embodiment, the segment magnets M1 through M36 being arranged to deviate by a same angle in the direction of magnetization. When seeing from a side surface, the direction of magnetization of the respective segment magnets M1 to M36 each is zero in Z component (vertical component), the direction of magnetization being parallel with the wafer W on the susceptor 6. Due to the aforementioned arrangement of the segment magnets M1 to M36, a magnetic field vector of the process chamber 3 takes a diction shown by a broad arrow mark in FIG. 4.

Figure 5:
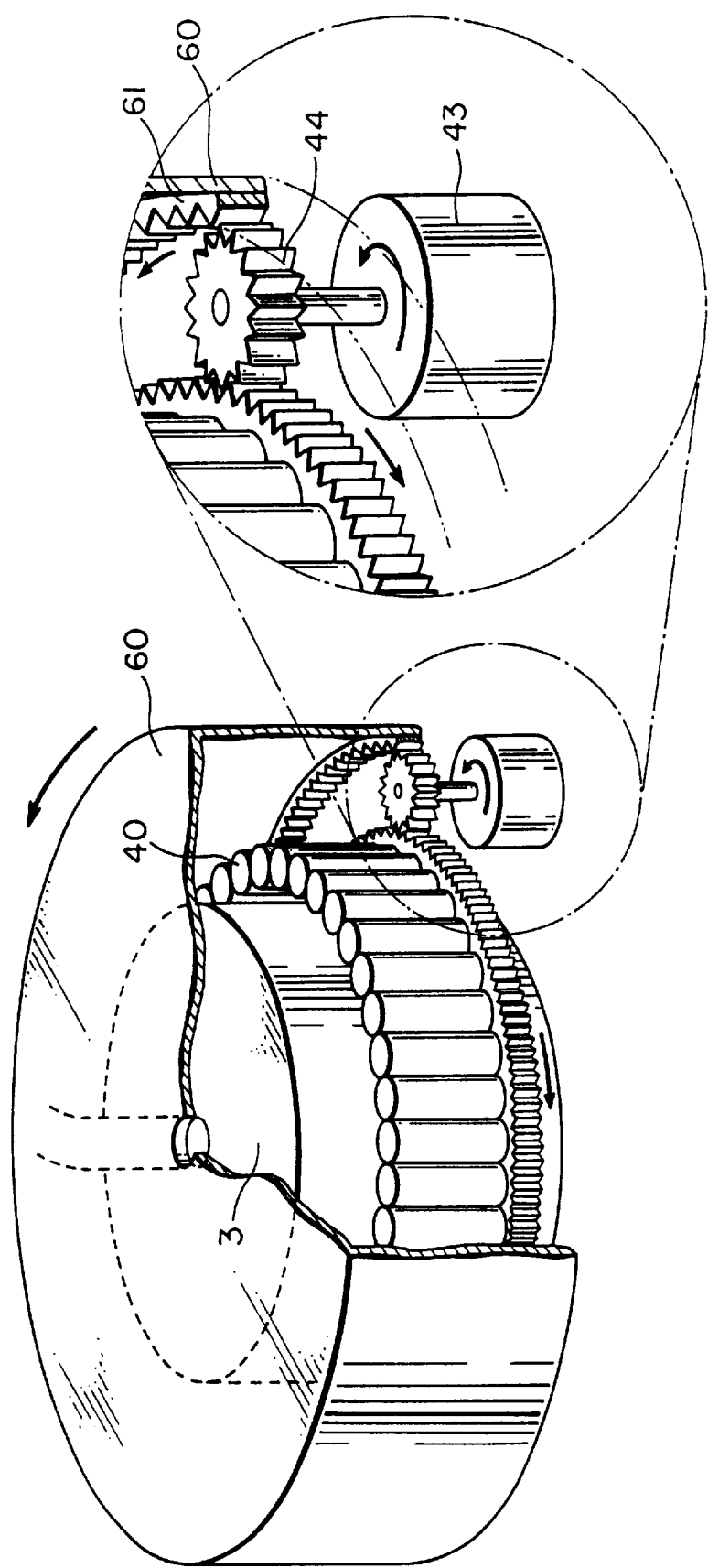
FIG. 5 is a perspective view showing a positional relation between a process chamber, a dipole ring magnet (DEN), and a shield plate involving the first embodiment.

Further, as shown in FIGS. 1 and 5, on an outer periphery surface of the rotary stage 42, an external gear surface 45 corresponding to teeth of a spur gear is formed. The external gear surface 45 is formed to engage with the pinion gear 44 that is a small gear and attached to a rotation axis of the motor 43. Rotation driving force of the motor 43 is transmitted to the DRM 40 through these pinion gear 44 and external gear surface 45.

Next, a shield plate 60 that characterizes the present embodiment will be explained. FIG. 5 is a perspective view showing a positional relation between the process chamber 3, the DRM 40 and the shield plate 60, all of which involve the present embodiment and a state of fitting thereof.

The shield plate 60 involving the present embodiment, as shown in FIGS. 1 and 5, has a cylindrical appearance and a diameter and depth so that it can contain the process chamber 3 and the DRM 40 disposed outside thereof from fisher outside. The shield plate 60 is obtained by processing a plate material of conductive material such as copper and iron into a cylinder. At the center of the bottom surface of which, a through hole for allowing a duct 23 is bored. The shield plate 60 is rotatably held coaxially with the DRM. Further, as shown in FIGS. 1 and 5, along an inner periphery surface portion of the shield plate 60, an internal gear surface 61 is formed. The internal gear surface 61 is provided with a shape that can engage with the pinion gear 44 attached to the rotation axis of the motor 43. As shown in FIGS. 1 and 5, the shield plate 60 and the DRM 40 engage with the pinion gear 44 through the internal gear surface 61 and the external gear surface 45, respectively. Accordingly, when the motor 43 rotates as shown by an arrow mark in FIG. 5, the DRM 40 and the shield plate 60 rotate in opposite directions of each other.

Figure 6:
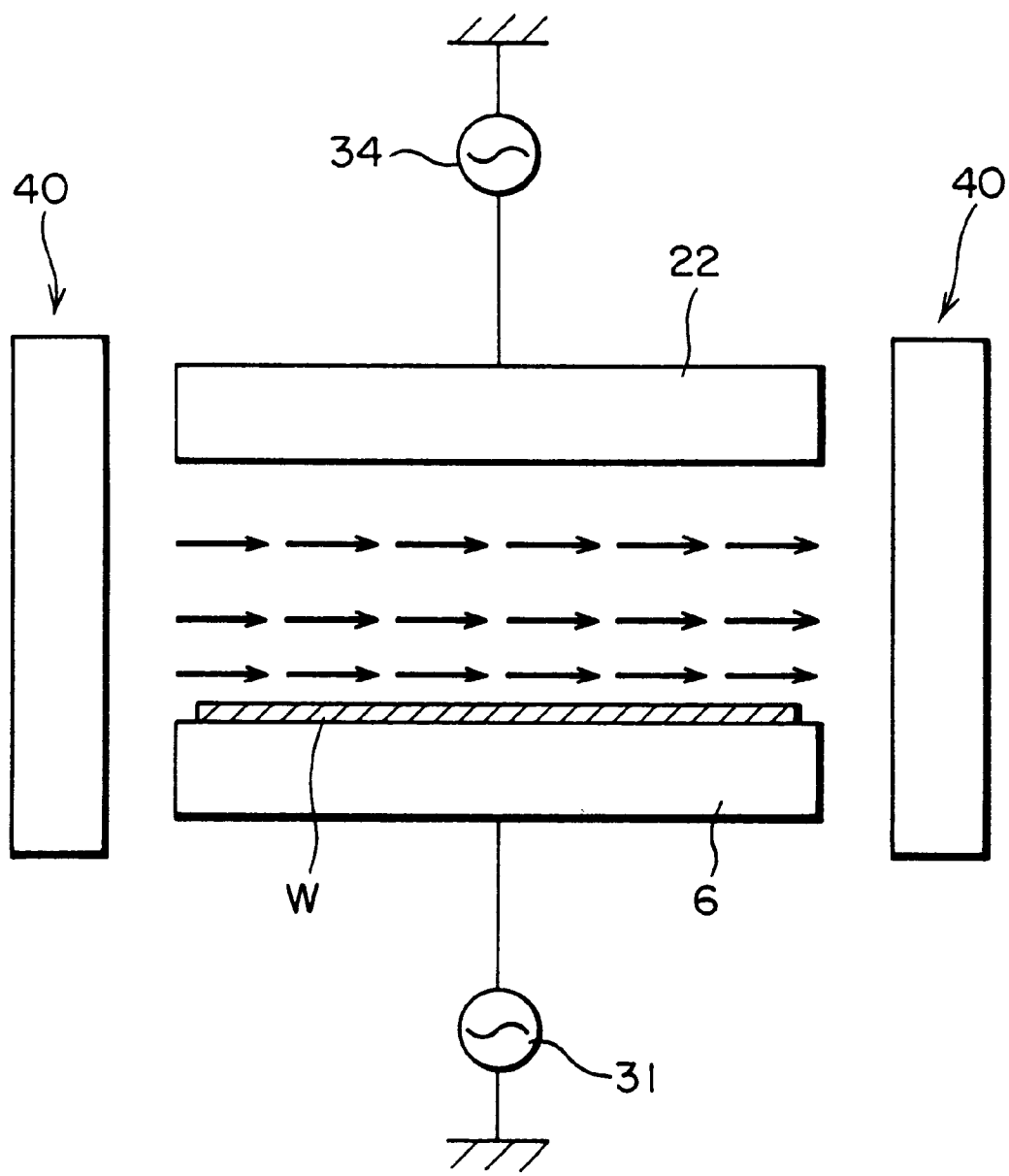
FIG. 6 is a vertical sectional view of an etching device involving the first embodiment.

FIG. 6 is a vertical sectional view showing a state of magnetic field of an etching device involving the present embodiment.

The main part of etching device 1 involving the present embodiment is configured as shown in the above. Due to the aforementioned arrangement of the DRM 40, when seeing the wafer W from a side surface toward a Y axis direction, as shown in FIG. 6, in a standstill state of the DRM 40, a linear magnetic field approximately parallel to a plane containing the wafer W is formed.

Figure 7:
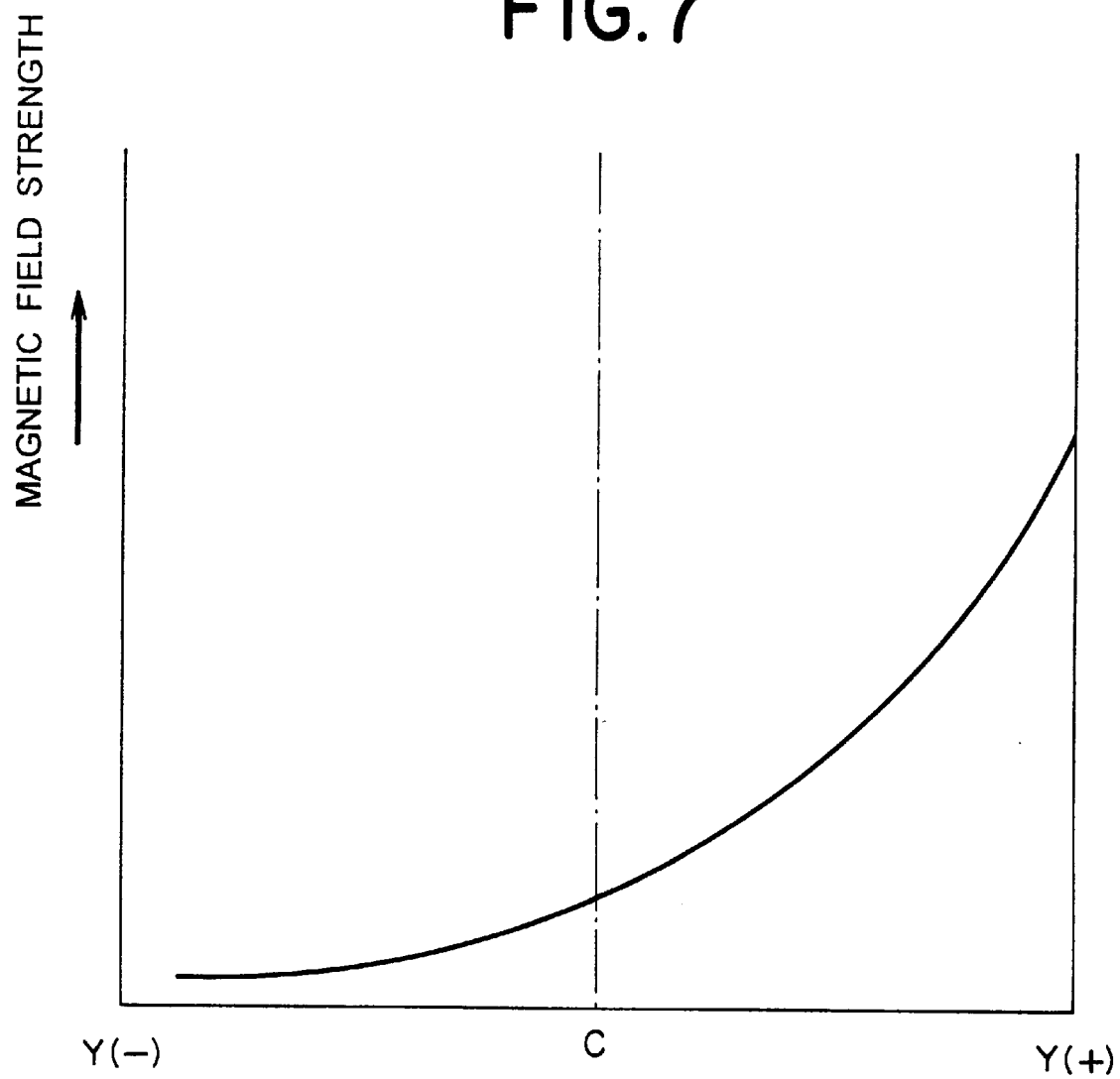
FIG. 7 is a diagram showing a state of magnetic field in a process chamber involving the first embodiment.

FIG. 7 is a diagram illustrate a profile a magnetic field in Y-axis direction in the process chamber involving the present embodiment.

Further, in a similar standstill state of the DRM 40, as shown in FIG. 7, toward a direction from Y(+) to Y(−) on the Y-axis, from one end to the other end of the wafer W, the magnetic field strength decreases gradually to form a gradient magnetic field. Such gradient magnetic field can be formed by differentiating magnetizing strength of the segment magnets from Y(+) to Y(−) along a circumference. The magnetic field strength in that case is set to be for instance approximate 60 mT (600 gauss) at one end where the magnetic field strength is maximum in the Y(+) direction on the wafer W, and to be approximate 12 mT (120 gauss) at the center (c) of the wafer W.

Next, by use of the etching device 1 involving the present embodiment, a silicon oxide film (SiO2) of a wafer W of for instance silicon is etched. Processes and actions in this case will be explained in the following.

On a side surface of the etching device 1, through a gate valve 9, a load lock chamber (not shown in the figure) is disposed side by side to accommodate wafer transfer means or the like such as a transfer arm or the like. During loading and unloading the wafer W, which is a substrate to be processed, in and from the process chamber 3, due to an action of an elevating motor 8, the susceptor 6 descends to a prescribed delivery position.

Next, the wafer W, after transferring from the load lock chamber into the process chamber 3, due to holding means such as an electrostatic chuck or the like, is mounted and fixed on a prescribed position on the susceptor 6. Thereafter, due to the action of the elevating motor 8, the susceptor 6 is ascended to a prescribed position for etching (a position shown in FIG. 1). At the same time, the inside of the process chamber 3 is evacuated by an exhaust device 12, after reaching a prescribed degree of low pressure from the process gas supply source 27, a prescribed process gas, for instance CF4, is supplied at a prescribed flow rate. Thereby, the pressure inside the process chamber 3 is set and maintained at a prescribed degree of low pressure, for instance 2666 mPa (20 mTorr).

Next, to the upper electrode 22 from the second high frequency power source 34 high frequency power of a frequency of 27.12 MHz and power of 2 kW is supplied. Thereby, the etching gas in the process chamber 3, that is gas molecules of CP4 gas, is dissociated to convert into a plasma-state gas. At the same time, to the susceptor 6, from the first high frequency power source 31, high frequency power of frequency of 2 MHz and power of 1 kW is supplied.

Above the wafer W, due to the DRM 40, a magnetic field parallel to a surface of the wafer W, namely a parallel magnetic field in a direction orthogonal to an electric field generated by the aforementioned high frequency power source, is formed. Further, due to the action of the motor 43, the rotary stage 42 is rotated, and thereby he DRM 40 being rotated around the outer periphery of the process chamber 3. With the rotation of the DRM 40, the aforementioned generated magnetic field parallel to the surface of the wafer W changes every moment a direction so as to affect uniformly on the wafer W. Due to the rotation of the motor 43, the shield plate 60 rotates coaxially with the DRM 40 in a direction opposite thereto.

Due to the magnetic field generated by means of the DRM 40, electrons in the plasma gas are caused to drift to collide with neutral molecules, resulting in further dissociation. Thereby, a plasma density in the process chamber 3 becomes extremely high. Further, even electrons in the bulk, which are not caused to drift, awe suppressed from diffusing due to the magnetic field. Accordingly, also from these points, the plasma density becomes high.

Moreover, with moving from one end of the wafer W toward the other end thereof the magnetic field strength becomes weaker. Accordingly, the aforementioned diffusion suppression effect on the drifted electrons becomes weaker. As a result, a concentration of the electrons at the end portion can be avoided, that is the electrons are suppressed from piling up on the wafer W. Thereby, the uniformity of the plasma density on the wafer W becomes excellent.

Under such plasma atmosphere, thereby generated high density etchant ions etch the silicon oxide film (S'02) on the wafer W surface. During the above etching, the high frequency (2 MHz) of relatively lower frequency supplied from the fist high frequency power source 31 to the susceptor 6 side controls the incident energy of the etchant ions independent of the aforementioned plasma generating step. Accordingly, without causing damage to the wafer W, a prescribed etching process can be performed. In addition, the etching process of high speed etching rate and high inplane uniformity can be performed to the wafer W.

At that time, the magnetic field generated by means of the DRM 40 tends to leak over all directions of the outer periphery of the process chamber 3. However, the shield plate 60 is disposed at the outer periphery of the side surface of the DRM 40 and rotates coaxially with the DRM 40 and in a direction opposite to that of the DRM 40. Accordingly, a magnetic field is generated in a direction opposite to that which tends to leak from the shield plate 60 toward the DRM 40. Thereby, both magnetic fields are cancelled out to result in practically no generation of the leakage magnetic field that leaks from the shield plate 60 toward the outer periphery. In the following, its effect will be explained.

(Comparative Experiment)

In order to confirm the effect of the device involving the present embodiment, various kinds of measurements performed under varying conditions.

For measurements, consider a point A that is 10 mm distant from a center of the DRM 40 during rotation by a straight line in a horizontal direction, a detection portion of a magnetic flux density measurement instrument is set to measure the magnetic flux density at A point.

The measurements of the magnetic flux density are performed under three different conditions. These three conditions are as follows. That is, under rotation of the DRM 40 without attaching the shield plate 60 (test 1), under fixation of the shield plate 60 in a standstill state (test 2) and under rotation of the shield plate 60 in a direction opposite to that of the DRM 40 (test 3).

Figure 8:
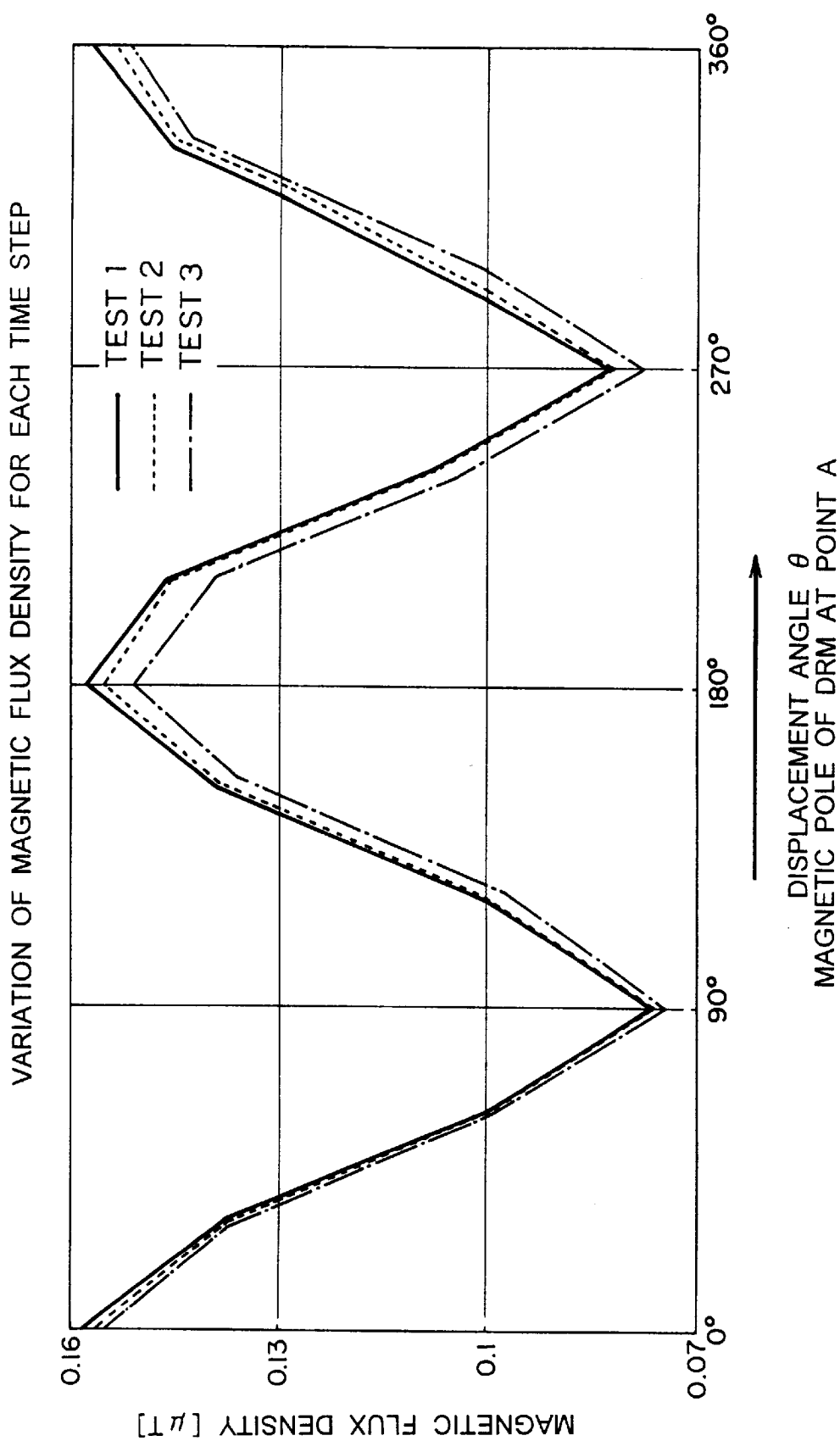
FIG. 8 is a diagram showing measurements of magnetic field at A point during operation of an etching device involving the first embodiment.

FIG. 8 is a diagram showing magnetic flux density measurements at A point.

Axis of ordinate of the diagram of FIG. 8 shows an absolute value of the magnetic flux density (unit:g T) at A point, axis of abscissa showing a displacement angle 6 that a magnetic field vector of the DRM 40 forms between a reference line (a straight line connecting a rotation center of the DRM 40 and point A).

As shown in FIG. 8, in all cases of tests 1 to 3, when 8=0° and 6=180°, the measurements show the maximum values, when 8=90° and 6=270°, the measurements showing the minimum values. That is, when the magnetic field vector of the DRM 40 becomes parallel with the reference line the magnetic field at point A shows the maximum value, when the magnetic field vector being orthogonal to the reference line the magnetic field showing the minimum value.

Figure 9:
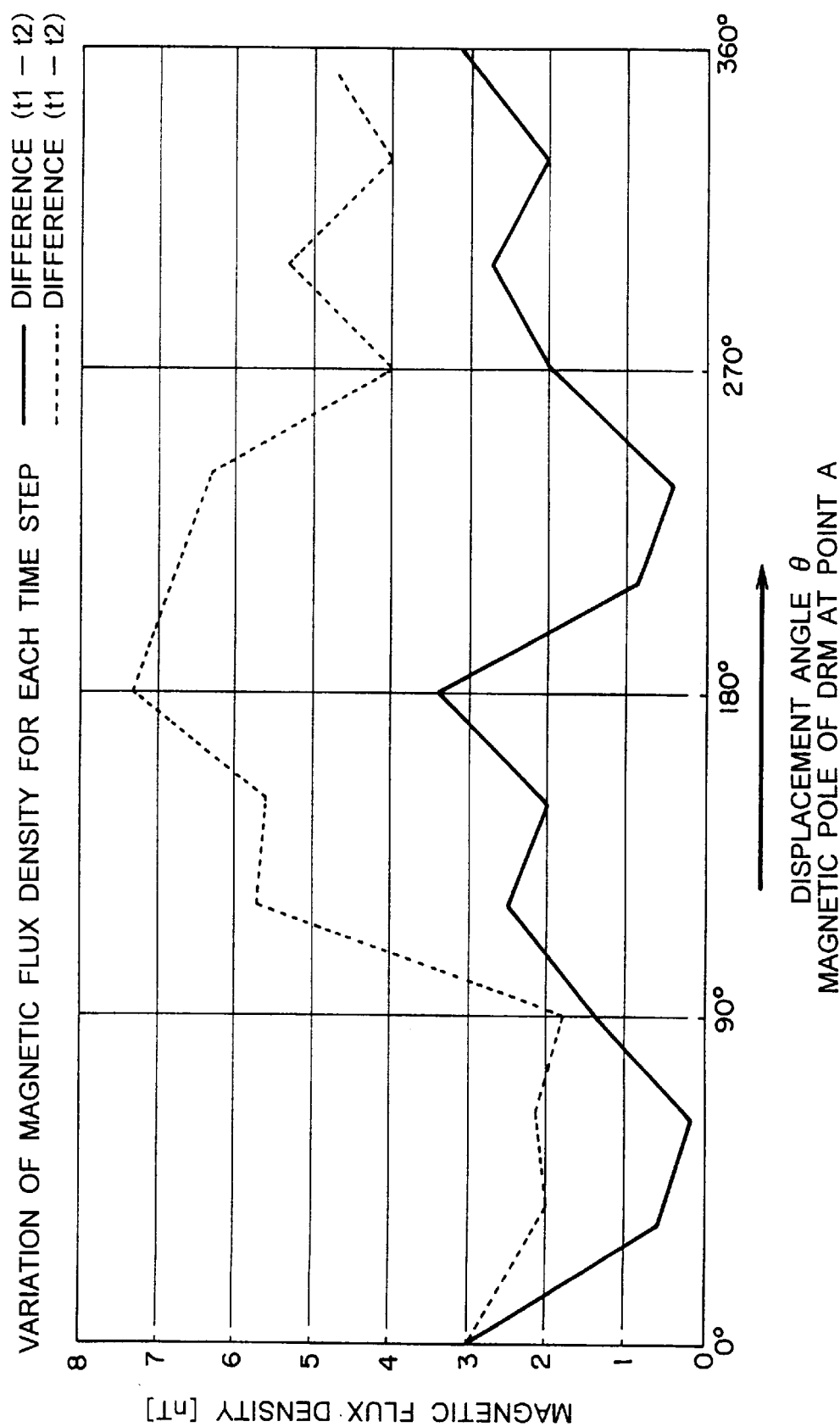
FIG. 9 is a diagram showing differences of magnetic field strength for each time step under each condition of tests 1 to 3.

FIG. 9, in order to make points of difference under the respective conditions of tests 1 to 3 understandable, differences of the magnetic flux densities are shown for each time step.

In FIG. 9, a solid line shows difference between magnetic flux density of test 1 and that of test 2 at the same displacement angle, a dashed line showing difference between magnetic flux density of test 1 and that of test 3 at the same displacement angle. In order to make the difference clear, in FIG. 9, a scale of the axis of ordinate of the diagram is made finer than that of FIG. 8.

As shown in the diagram of FIG. 9, in all displacement angles 6, the differences (t1–t3) between te test 1 and test 2 are larger than those (t1–t2) between the test 1 and test 3. That is, in comparison with the case when the shield plate 60 is fixed in a standstill state, in the case when the shield plate 60 is rotated coaxially with the DRM 40 in a direction opposite thereto, an influence of the leakage magnetic flux on the point A is smaller. According to a detailed calculation, it is confirmed that when the shield plate 60 is fixed in a standstill state, the leakage magnetic flux can be reduced by 2±1%, when the shield plate 60 is rotated coaxially with the DRM 40 and in a direction opposite thereto, the leakage magnetic flux being reduced by a level of 4±2%.

A reason why such an effect can be obtained is considered as follows. Like the DRM 40, when a shield plate made of plate-like conductive material such as a metal is disposed around a rotating magnet, in the magnetic flux coming out of the magnet passing through the inside of the shield plate, there occurs an electromagnetic induction phenomenon. Thereby, a magnetic line of force in a direction opposite to that of the magnetic line of force coming out of the magnet is caused to generate from the shield plate.

The magnetic flux in the opposite direction is generated for each of the segment magnets M1 to M36 of FIG. 4. The magnitude thereof relates to an angle that each of the segment magnets M1 to M36 forms between a diameter direction of the DRM 40, showing the maximum alue in the vicinity of M1, M36, M18 and M19, the mum value in the vicinity of M9, M10, M27 and M28. For the remng segment magnets each, the magnitude of the metic line of force is proportional to a component parallel to the diameter direction of the magnetic line of force, becoming smaller as approaches to M9, M10, M27 and 128, becoming gradually larger as approaches to M1, M36, M18 and M19. When seeing this as a whole shield plate 60, a magnetic field vector in a direction opposite to a broad arrow mark in FIG. 4 is considered to form.

Here, the number of the magnetic line of force generated at each position of the shield plate 60 due to the electromagnetic induction, due to Faraday's law of electromagnetic induction, is proportional to the time rate of change of the magnetic flux. When the shield plate 60 and the DRM 40 are rotated in the direction opposite to each other, an increase of the relative speed between these is caused. Thereby, the number of the magnetic line of force generated due to the electromagnetic induction at each portion of the shield plate 60 increases. When seeing this as the whole shield plate 60, the magnetic field vector in a direction opposite to that of the aforementioned DRM 40 increases. It is considered that these magnetic field vectors of the DRM 40 and the shield plate 60 cancel out with each other resulting in weakening of the leakage magnetic flux.

Accordingly, by setting the rotation number of the shield plate 60 at an appropriate value, the magnetic flux is decreased in leaking from the process chamber 3.

As a result, even if a device identical with the etching device 1 is disposed in close vicinity thereof, the magnetic field can be suppressed from interfering with each other. Thereby, a desired object to etch in a short time and with accuracy can be performed. Further, the leakage of the magnetic flux to a place distant from the etching device 1 can be suppressed resulting in suppressing a magnetic influence on periphery instruments.

Further, the segment magnets M1 to M36 that are anisotropic segment magnets constituting the DPM 40 are all formed in the same circular columns. Accordingly, by manufacturing lots of segments of one kind (or several kinds of different magnetic forces) and by appropriately changing the arrangement thereof, an intended DRM 40 can be configured. Accordingly, by changing only a state of arrangement, an anisotropic segment magnet of desired direction of magnetization can be easily obtained, the manufacturing costs also being suppressed low.

The present invention is not restricted to the embodiments that are mentioned above or will be mentioned later. For instance, in the above embodiment, the DRM 40 is configured of 36 segment magnets M1 to M36, however, the number of the segment magnets being able to select arbitrarily as demands arise.

Further, in the above embodiment, an etching device is taken up as a representative example for explanation. However, without resting this, the present invention can be applied in other plasma process devices such as for instance an ashing device, a sputtering device and a CVD device. Further, the substrates to be processed can be, other than the wafers, substrates for LCD.

(Embodiment 2)

In the following, a second embodiment of the present invention will be explained. In the explanation of the following embodiments, duplicating portions with the preceding embodiment will be omitted from explanation.

Figure 10:
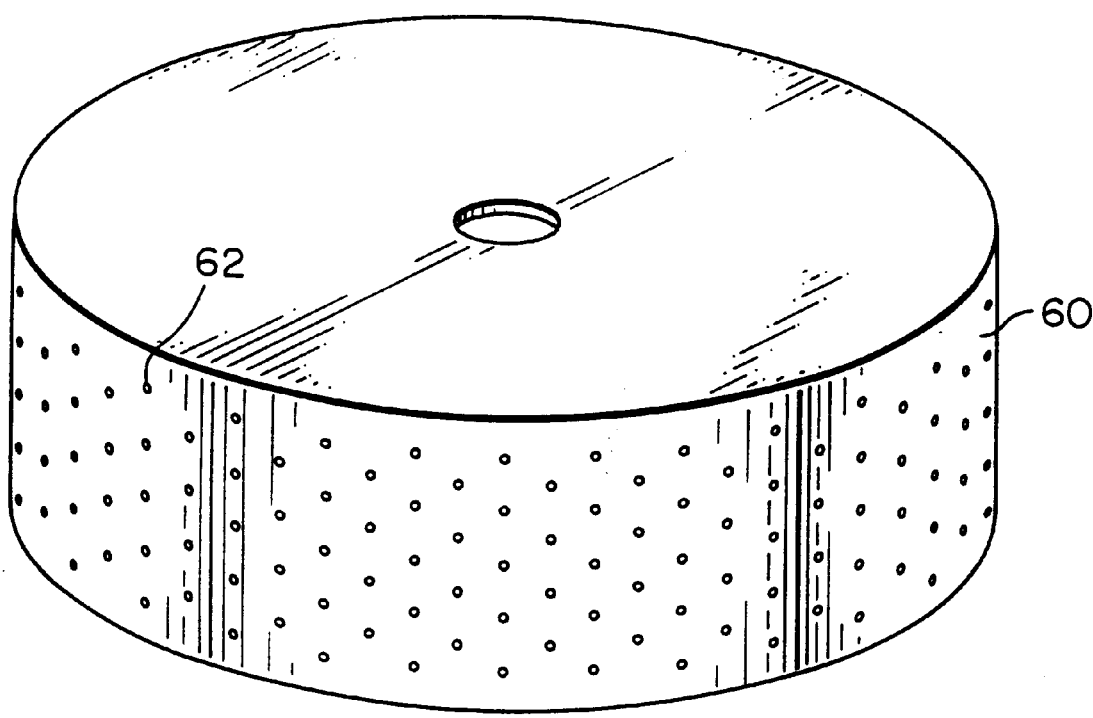
FIG. 10 is a perspective view of a shield plate involving a second embodiment of the present invention.

FIG. 10 is a perspective view of a shield plate 60 involving the present embodiment. As shown in FIG. 10, the shield plate 60 involving the present embodiment, on a side wall surface a plurality of minute through holes 62,—is bored.

By boring lots of such minute trough holes 62,—, at the side wall surface of the shield plate 60, due to the electromagnetic induction, a circular current is made easy to flow. Thereby, a magnetic vector opposing to the magnetic vector of the DRM 40 becomes easy to form. As a result, a particular effect that the leakage magnetic flux of the DPM 40 can be further effectively cancelled out can be obtained.

(Embodiment 3)

In the following, a third embodiment involving the present invention will be explained.

Figure 11:
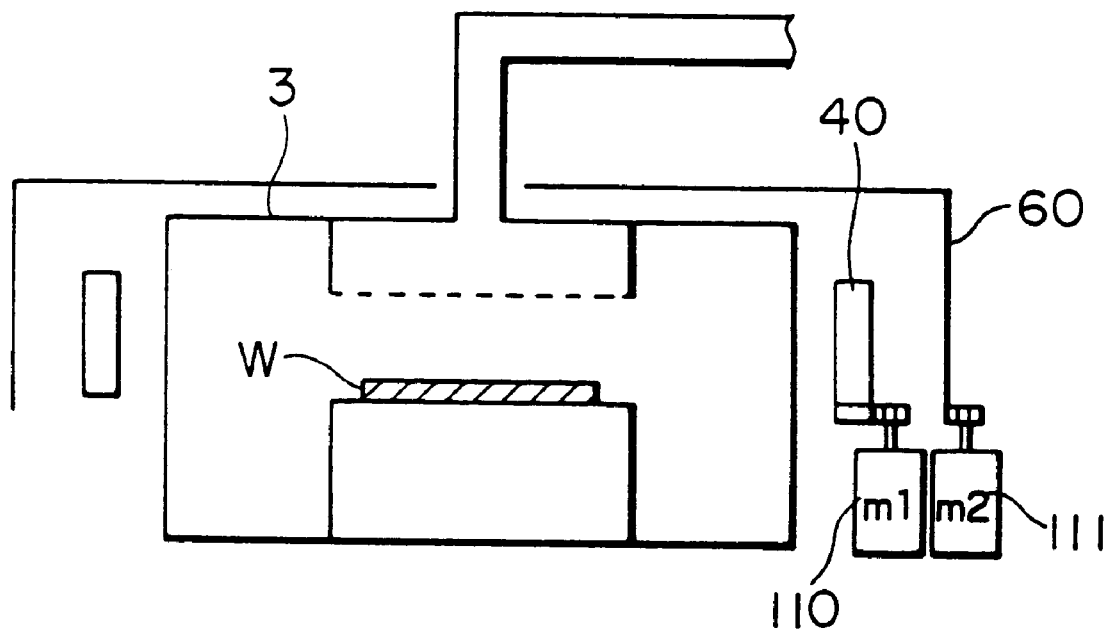
FIG. 11 is a diagram showing a process device involving a third embodiment of the present invention.

FIG. 11 is a diagram schematically showing a process device involving the present embodiment. In the device involving the present embodiment, different from the aforementioned Embodiment 1, the DRM 40 and the shield plate 60 are provided with independent driving motors 110 and 111 respectively to control the rotation numbers independent from each other.

In the device of the present embodiment, independent from the rotation number of the DRM 40, the rotation number of the shield plate 60 can be controlled. Accordingly, in response to the leakage magnetic flux generated due to the rotation of the DRM 40, with the most appropriate rotation number the shield plate 60 can be rotated. Thereby, the leakage magnetic flux can be controlled with high precision.

(Embodiment 4)

Figure 12:
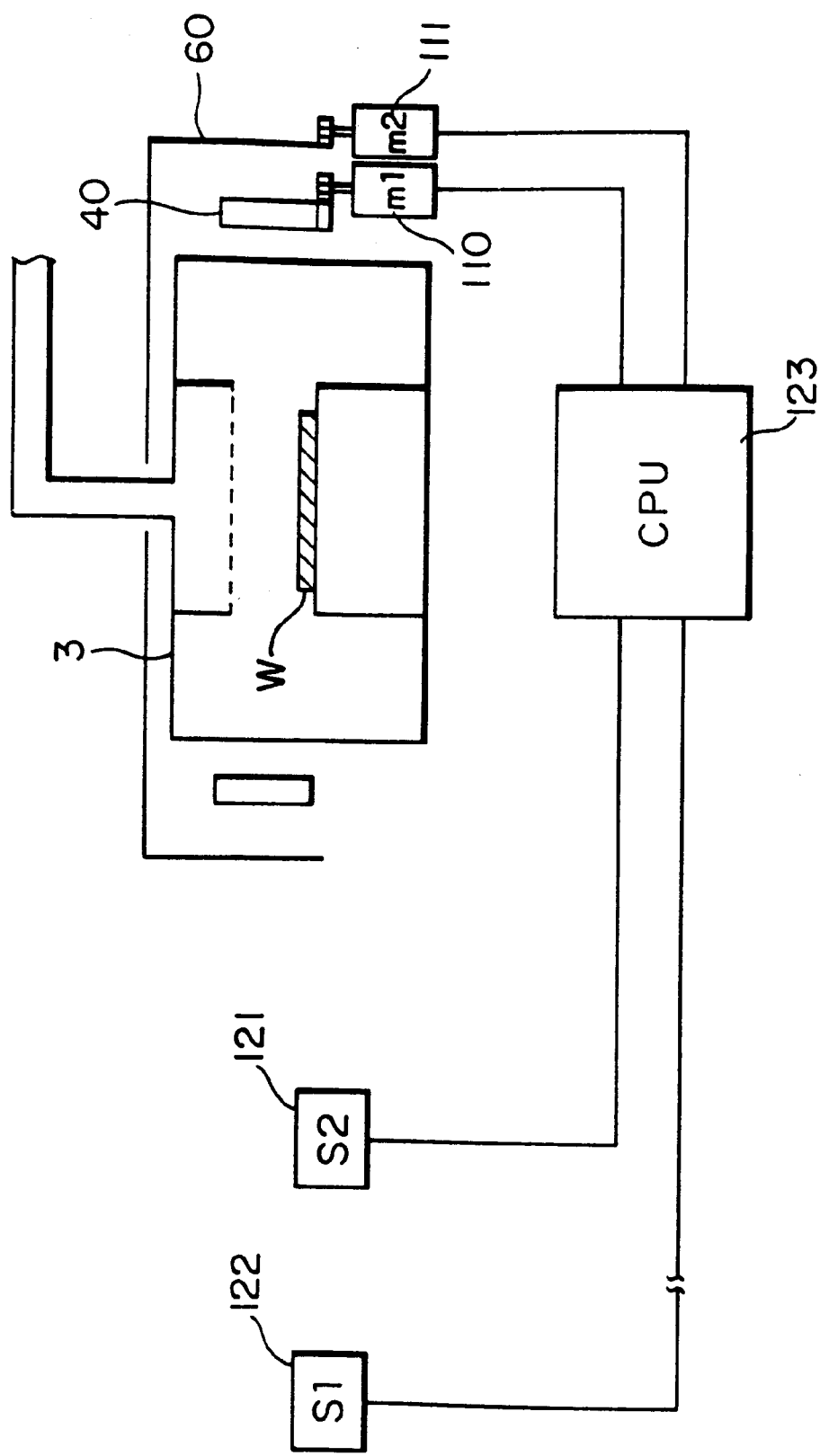
FIG. 12 is a block diagram showing a configuration of a process device involving a fourth embodiment of the present invention.

FIG. 12 is a block diagram schematically showing a configuration of a process device involving the present embodiment.

As shown in FIG. 12, in the device involving the present embodiment, independent motors 110 and 111 are disposed to the DRM 40 and the shield plate 60 respectively to rotate/drive these independently. In addition to the above, one or more of sensors such as sensors 121, 122 for detecting a magnetic flux density are disposed. Here, the sensors for detecting the magnetic flux density are disposed at positions where an influence of the leakage magnetic flux from the DRM 40 is concerned and positions in the vicinity of the process device. As an example of the positions in the vicinity of the process device, one where other plasma process unit is disposed for instance in the multi chamber type process system can be cited. Based on the strength of the magnetic flux density detected by the sensors 121 and 122, the motor 111 effecting the shield plate 60 of the process device to rotate, resultantly the rotation number of the shield plate 60 is controlled by a CPU 123. Thereby, generation of the leakage magnetic flux can be suppressed as low as possible.

In the process device involving the present embodiment, based on the actually detected leakage magnetic flux density, the rotation number of the shield plate 60 is controlled. As a result, the leakage magnetic flux can be more accurately cancelled out. Accordingly, an adverse effect of the leakage magnetic flux on the periphery instruments can be effectively decreased.

According to the inventions, in the plasma process device provided with the DRM, in any of a place in close vicinity to the present device and a place distant therefrom, the leakage magnetic flux from the device can be suppressed from generating. Accordingly, a magnetic influence on the periphery instruments can be decreased. Further, even when other plasma process device is disposed with an appropriate distance separated, in the respective devices, the uniformity of the magnetic field to be generated becomes disturbed with difficulty. Accordingly, a degree of freedom in design in constructing a multi chamber type system can be increased.

Further, outside the DRM the shield plate is disposed to rotate the shield plate coaxially with the DRM in a direction opposite of each other. Only rotating like this, the aforementioned suppression effect of the leakage magnetic flux can be obtained. Accordingly, an influence on a structure of the whole device can be suppressed as small as possible.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A process device, comprising:

a generally cylindrical chamber accommodating a substrate to be processed;

an energy supply, disposed in the chamber, for supplying energy to a gas introduced in the chamber to convert the gas into a plasma-state gas;

a dipole ring magnet, having portions disposed cylindrically surrounding the chamber, on an outer periphery of the cylinder a plurality of magnets being disposed, the dipole ring magnet be rotated in one direction around an axis passing through a center portion of the bottom of the cylinder;

a shield plate disposed surrounding a circumference of the dipole ring magnet and supported rotatable coaxially with a rotation axis of the dipole ring magnet; and a shield plate rotation mechanism which rotates the shield plate in a direction opposite to that of the dipole ring magnet.

2. The process device as set forth in claim 1 wherein the shield plate rotation mechanism rotates the shield plate with a rotational speed subordinate to that of the dipole ring magnet.

3. The process device as set forth in claim 2 wherein the shield plate rotation mechanism comprises:

an external ear disposed on an outer periphery surface of the dipole ring magnet;

an internal gear disposed on an inner periphery surface of the shield plate; and a pinion gear engaging with the external gear and the internal gear.

4. The process device as set forth in claim 2 wherein the shield plate has a plurality of minute through holes bored therethrough.

5. The process device as set forth in claim 1 wherein the shield plate rotation mechanism rotates the shield plate with a rotational speed controllably set independently from a rotation of the dipole ring magnet.

6. The process device as set fort in claim 5 wherein the shield plate rotation mechanism comprises a dedicated motor disposed for the rotation thereof.

7. The process device as set forth in claim 6, further comprising a sensor at a secluded position outside the shield plate for detecting a magnetic flux density, and wherein the rotation of the motor is controlled based on the detected magnetic flux density.

8. The process device as set forth in claim 6 wherein the shield plate has a plurality of minute through holes bored therethrough.

9. The process device as set forth in claim 5, further comprising a sensor at a secluded position outside the shield plate for detecting a magnetic flux density, and wherein the shield plate rotation mechanism controls the rotational speed of the shield plate based on the detected magnetic flux density.

10. The process device as set forth in claim 5 wherein the shield plate has a plurality of minute through holes bored therethrough.

11. The process device as set forth in claim 1 wherein the shield plate has a plurality of minute through holes bored therethrough.

12. A process device, comprising:

a process chamber where processing of a substrate can be performed, the process chamber having a chamber wall;

a conductive member, disposed in the process chamber, for supplying energy to a gas introduced in the chamber to convert the gas into a plasma-state gas;

a dipole ring magnet, having portions disposed cylindrically about the chamber, for generating a magnetic field in the chamber, the dipole ring magnet rotating in one direction around an axis of the cylinder through a central portion of the bottom of the cylinder;

a shield plate disposed surrounding a circumference of the dipole ring magnet and supported rotatably without coming into contact with the dipole ring magnet; and a shield plate rotation mechanism which rotates the shield plate so as to suppress magnetic flux leaking outside the dipole ring magnet.

13. The process device as set forth in claim 12 wherein the shield plate rotation mechanism rotates the shield plate with a rotational speed subordinate to that of the dipole ring magnet.

14. The process device as set forth in claim 13 wherein the shield plate has a plurality of minute through holes bored therethrough.

15. The process device as set forth in claim 12 wherein the shield plate rotation mechanism rotates the shield plate with a rotational speed controllably set independent from a rotation of the dipole ring magnet.

16. The process device as set forth in claim 15, further comprising a sensor at a secluded position outside the shield plate for detecting a magnetic flux density, and wherein the shield plate rotation mechanism controls a rotational speed of the shield plate based on the detected magnetic flux density.

17. The process device as set forth in claim 15 wherein the shield plate has a plurality of minute through holes bored therethrough.

18. The process device as set forth in claim 12 wherein the shield plate has a plurality of minute through holes bored therethrough.

19. A process device, comprising:

process chamber for processing a substrate;

energy supplying means, disposed in the process chamber, for supplying energy to a gas to convert the gas into a plasma-state gas; magnetic field generating means, having portions disposed surrounding the process chamber and rotatable around an axis of the chamber that passes through a central portion of the bottom of the chamber, for generating a magnetic field in the process chamber;

magnetic flux shielding means, disposed surrounding a circumference of the magnetic field generating means without coming into contact therewith, for shielding magnetic flux leaking outside the magnetic field generating means; and rotating means for rotating the magnetic flux shielding means so that the magnetic flux is suppressed from leaking.

20. The process device as set forth in claim 19 wherein the rotating means rotates the magnetic flux shielding means with a rotational speed subordinate to that of the magnetic field generating means.

* * * * *

UNITED STATES PATENT AND TRADEMARK OFFICE
CERTIFICATE OF CORRECTION

PATENT NO. : 6,436,230 B1
DATED : August 20, 2002
INVENTOR(S) : Kondo et al.

It is certified that error appears in the above-identified patent and that said Letters Patent is hereby corrected as shown below:

Column 1,
Line 13, "CYD" should be -- CVD --.
Line 28, after "magnet" open parenthesis is missing before "hereinafter".

Column 2,
Line 30, "wail" should be -- wall --.

Column 3,
Line 6, "(DEN)" should be -- (DRM) --.

Column 4,
Line 14, "disposed the process" should read -- disposed. In the process --.

Column 5,
Line 13, "CF4 or C4F8" should be -- CF4 or C4 F8 --.

Column 6,
Line 21, "diction" should be -- direction --.
Line 65, "illustrate" should be -- illustrating --.

Column 7,
Line 13, "SiO2" should be -- SiO2 --.
Line 34, "CF4" should be -- CF4 --.
Line 42, "CP4" should be -- CF4 --.
Line 52, "he" should be -- the --.

Column 8,
Line 10, "(S'O2)" should be -- (SiO2) --.

Column 9,
Line 9, "te" should be -- the --.
Line 34, "alue" should be -- value --.
Line 35, "mum" should be -- minimum --.
Line 36, "remng" should be -- remaining --.
Line 37, "metic" should be -- magnetic --.
Line 40, "128" should be -- M28 --.

UNITED STATES PATENT AND TRADEMARK OFFICE
CERTIFICATE OF CORRECTION

PATENT NO.    : 6,436,230 B1
DATED         : August 20, 2002
INVENTOR(S)   : Kondo et al.

It is certified that error appears in the above-identified patent and that said Letters Patent is hereby corrected as shown below:

Column 10,
Line 1, "1" should be -- 1 --.
Line 5, "DPM" should be -- DRM --.
Line 22, "resting" should be -- restricting --.

Column 12,
Line 10, "ear" should be -- gear --.

Column 14,
Line 5, after "gas", there should be a carriage return so that "magnetic field" begins a new line.

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,436,230 B1
DATED : August 20, 2002
INVENTOR(S) : Kondo et al.

It is certified that error appears in the above-identified patent and that said Letters Patent is hereby corrected as shown below:

Column 1,
Line 28, replace "hereinafter" with -- (hereinafter --;

Column 5,
Line 14, replace "CF4 or C4F8" with -- $CF_4$ or $C_4F_8$ --;

Column 7,
Line 14, replace "SiO2" with -- $SiO_2$ --;
Lines 35 and 43, replace "CF4" with -- $CF_4$ --; and Column 8,
Line 10, replace "(S'O2)" with -- $SiO_2$ --.

Signed and Sealed this

Eighth Day of June, 2004

JON W. DUDAS
*Acting Director of the United States Patent and Trademark Office*